United States Patent [19]
Walburn et al.

[11] Patent Number: 5,336,095
[45] Date of Patent: Aug. 9, 1994

[54] FLEX CIRCUIT INTERFACE FOR CO-PLANAR PCBS

[75] Inventors: Douglas M. Walburn; Morgan J. Bradley, both of Harrisburg; John W. Jones, New Cumberland, all of Pa.; Robert D. Irlbeck, Greensboro; Robert M. Renn, Pfafftown, both of N.C.

[73] Assignee: The Whitaker Corporation, Wilmington, Del.

[21] Appl. No.: 61,987

[22] Filed: May 13, 1993

[51] Int. Cl.$^5$ .............................................. H01R 9/09
[52] U.S. Cl. ..................... 439/67; 439/77; 439/329
[58] Field of Search ............ 439/65, 67, 74, 77, 439/329, 492, 493

[56] References Cited

U.S. PATENT DOCUMENTS

| | | | |
|---|---|---|---|
| 4,693,529 | 9/1987 | Stillic | 439/67 |
| 5,026,290 | 6/1991 | Pevy | 439/67 |
| 5,161,981 | 11/1992 | Peak et al. | 439/67 |
| 5,263,868 | 11/1993 | Renn et al. | 439/67 |

*Primary Examiner*—Larry I. Schwartz
*Assistant Examiner*—Hien D. Vu

[57] ABSTRACT

An interface for connecting co-planar printed circuit ("PC") boards (10,20) using a compressible circuit (50) for bridging the PC boards (10,20), a base (80) underlying the second PC board and integrally attached thereto, and a support housing (30) which sandwiches the compressible circuit (50) against the two PC boards (10,20). The compressible circuit (50) is insertable into the underside of the support housing (30) and may be electro-optically aligned therewith. The compressible circuit (50) is then staked to the support housing (30), and the support housing is mounted on the two PC boards (10,20). In order to mount the support housing (30) on the PC boards (10,20) with the requisite precision, the support housing (30) is provided with alignment means including resilient finger (39) on the underside, and the second PC board (20) is provided with cooperating guide tabs (25).

The electro-optic alignment and attachment of the compressible circuit (50) with the support housing (30) together with the precise alignment of the support housing (30) over the two PC boards (10,20) insures a precision high-density interface.

12 Claims, 6 Drawing Sheets

500,095

FLEX CIRCUIT INTERFACE FOR CO-PLANAR PCBS

FIELD OF THE INVENTION

The present invention relates to the interconnection of co-planar printed circuit boards and, in particular, to a precision interface which accurately connects the respective traces of two co-planar circuit boards via a connector which incorporates a flexible compressible circuit.

BACKGROUND OF THE INVENTION

It is often desirable to interface two printed circuit boards while maintaining them in a co-planar orientation. This requires a plurality of conductive jumpers to bridge the respective traces (or contact pads) of the two circuit boards, as well as a removable support assembly to lock the circuit boards together and to hold the jumpers in place against the appropriate traces or pads.

As circuit boards evolve toward higher densities, it is becoming increasingly difficult to complete a junction as described above. With current photolithographic techniques, the contact pads on a circuit board are precisely formed on the underlying board. Hence, the typical pitch between contact pads rarely exceeds 1 mm, and the tolerances in their positioning is very small. If reliable contact is to be made between the contact pads of two such boards, then the pads of both boards must be precisely aligned with the conductive jumpers which bridge the two boards. The need for precision is heightened even further when controlled impedance requirements are imposed on the junction.

Certain applications impose controlled impedance requirements ranging between 50 to 120 ohms for each point of electrical contact. Conventional impedance control is achieved by varying the following:

1. The shape of the contact pads or traces.
2. The distance between contact pads/traces.
3. The signal-to-ground structure.
4. The dielectric constant of the insulating board material.

In a co-planar PC board interface, all of the above-referenced factors are upset when the alignment is improper. As a result, the impedance constraints are more difficult to achieve.

Consequently, it remains a vexing problem to properly interface two co-planar high-density printed circuit boards, especially in a controlled impedance application.

SUMMARY OF THE INVENTION

The present invention provides an improved interface for impermanent co-planar connection of two printed circuit ("PC") boards. An underlying base is attached beneath the first PC board such that a ledge protrudes from the board. The second PC board is seated on the ledge adjacent to the first PC board. A compressible circuit bridges the two PC boards, and a plurality of conductive jumpers are provided on the flexible compressible circuit for electrically connecting the contact pads of the first PC board to the contact pads of the second PC board. The compressible circuit is held against the PC boards by a support housing. The compressible circuit is mounted in the support housing by electro-optically aligning the two components and then staking the compressible circuit to the support housing. The support housing is then mounted over the two PC boards with the compressible circuit compressed therebetween. The support housing fixes the relative vertical positions of the two PC boards in a substantially co-planar relation. In order to fix the relative horizontal positions of the PC boards and the compressible circuit with necessary precision, the support housing is provided with alignment means on the underside which conform to guide tabs protruding upwardly from the first PC board. In the preferred embodiment, the alignment means in the support housing includes an alignment facet for receiving a guide tab, and a resilient finger which engages another guide tab to maintain a resilient bias thereagainst. The support housing is aligned by positioning one guide facet over the corresponding guide tabs, and by snapping the resilient finger over the other guide tab. The resilient finger temporarily anchors the support housing on the co-planar PC boards during further assembly. The support housing is then securely mounted by screws, pylons or the like which penetrate pre-formed alignment holes in the second PC board and are anchored to the protruding ledge of the base.

The electro-optic alignment and attachment of the compressible circuit with the support housing allows extremely precise positioning of the conductive jumpers relative to the guide facets, and the cooperating guide facets and alignment tabs allow precise positioning of the support housing relative to the first PC board. Likewise, the support housing is precisely aligned with the second PC board by the anchoring screws which penetrate the alignment holes of the second PC board.

In sum, the above-described alignment relationships combine to yield a precise overall alignment of the conductive jumpers between the contact pads of the first PC board to the contact pads of the second PC board.

In addition, an elastomeric compression plug may be seated in the underside of the support housing to resiliently bias the compressible circuit against the two PC boards. The compression plug maintains the conductive jumpers of the compressible circuit in electrical contact with the contact pads of the two PC boards and thereby accommodate any differences in thickness between the two PC boards.

Other advantages and results of the invention are apparent from a following detailed description by way of example of the invention and from the accompanying drawings.

DETAILED DESCRIPTION OF THE INVENTION

Figure 1:
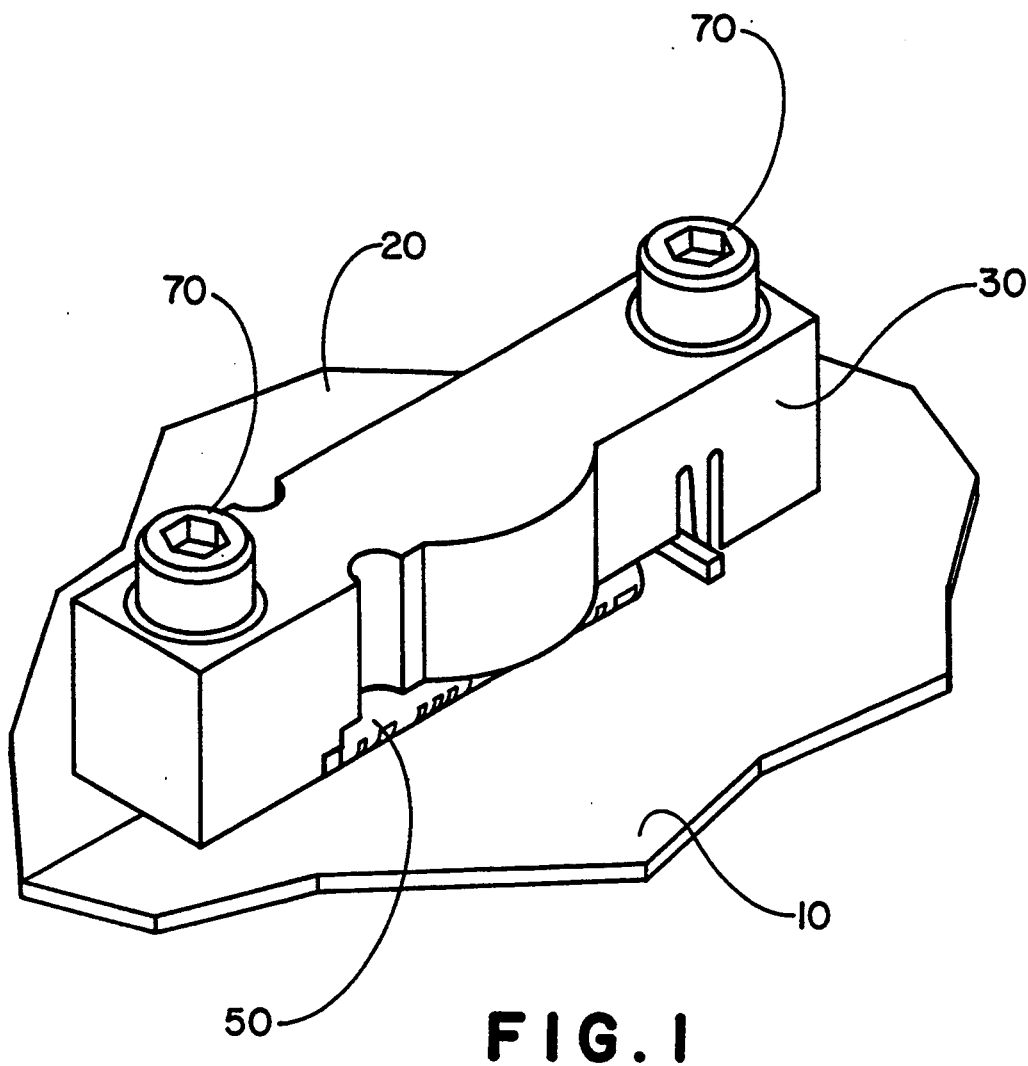
FIG. 1 is a perspective view of an exemplary interface for connecting two co-planar printed circuit ("PC") boards 10 and 20 in accordance with the present invention.

With more particular reference to the drawings, FIG. 1 illustrates a perspective view of an interface for connecting two co-planar printed circuit ("PC") boards according to the present invention.

The two PC boards include a first PC board 10 and a second PC board 20 which are electrically and mechanically joined at the interface. Selected conductive traces 12 of the first PC board are electrically connected with corresponding conductive traces 22 of the second PC board via a compressible circuit 50 which bridges the two PC boards 10 and 20. The compressible circuit 50 is provided with a plurality of discrete jumper traces that establish the proper trace-to-trace connections across the two PC boards 10 and 20.

Figure 2:
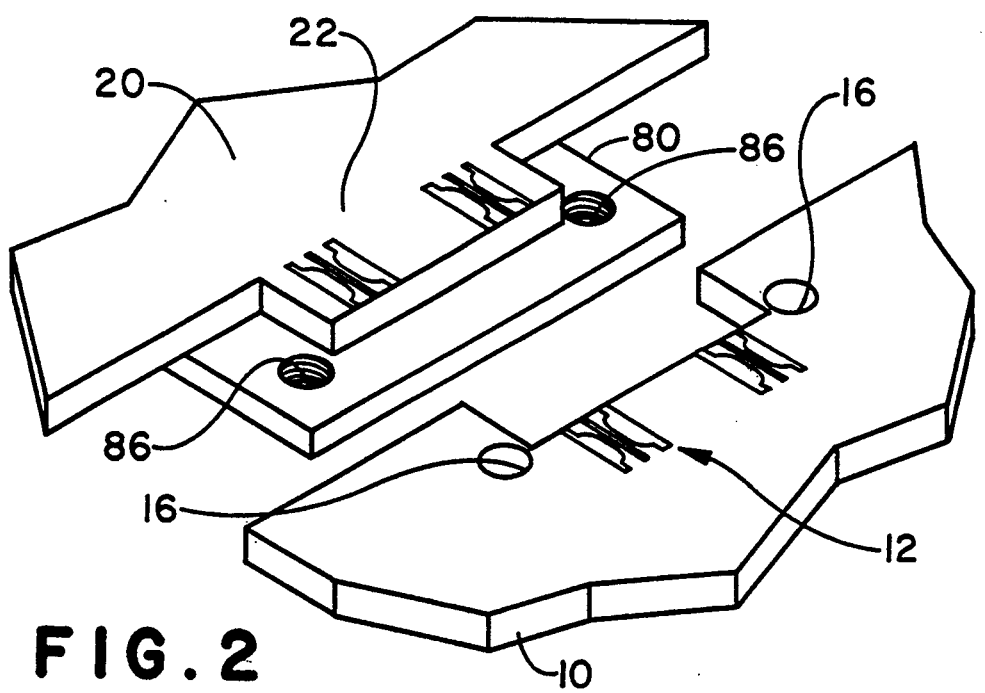
FIG. 2 is a top perspective view of two cooperating PC boards 10 and 20 as in FIG. 1 which further illustrates an underlying base 80 which is integrally attached beneath the second PC board 20 to provide a protruding ledge for seating the first PC board 10.
Figure 3:
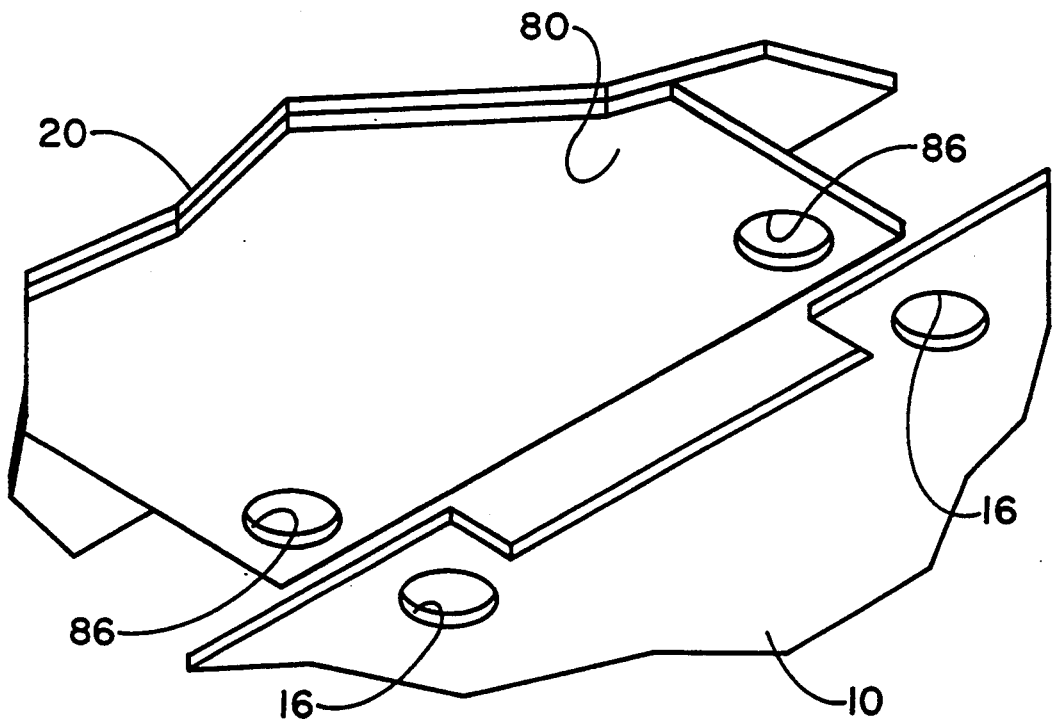
FIG. 3 is a bottom perspective view of the two cooperating PC boards 10 and 20 of FIG. 2.

As shown in FIGS. 2 and 3, the two PC boards 10 and 20 are preferably formed to cooperate along a common edge, thereby facilitating docking. For instance, a notch may be formed along the mating edge of the first PC board 10 as shown, and the second PC board 20 may be formed with a corresponding projection along its mating edge which fits into the notch. In addition, an underlying base 80 is integrally attached beneath the second PC board 20 such that a protruding ledge is formed. Base 80 may be any structure capable of providing a flat ledge as shown. However, it is most convenient if base 80 is a blank PC board that is fused, glued, riveted, bolted or otherwise attached beneath the second PC board 20.

The first PC board 10 is formed with a plurality of conductive traces (or contact pads) 12 which are exposed along the mating edge to allow interconnection. Likewise, second PC board 20 is provided with a corresponding plurality of conductive traces 22 exposed along its mating edge. Preferably, the conductive traces 12 of the first PC board 10 are exposed inwardly of the notch, and the conductive traces 22 of the second PC board 20 are exposed along the projection. This way, the exposed traces 12 and 22 of the respective PC boards 10 and 20 are roughly aligned when the projection of board 20 is docked with the notch of board 10.

A plurality of holes 86 are formed through the protruding ledge in the underlying base 80, and upon docking of PC boards 10 and 20, holes 86 become aligned with a corresponding plurality of holes 16 in the first PC board 10. Holes 86 and 16 provide a means by which PC boards 10 and 20 can be bolted or riveted together in the docked position.

Figure 4:
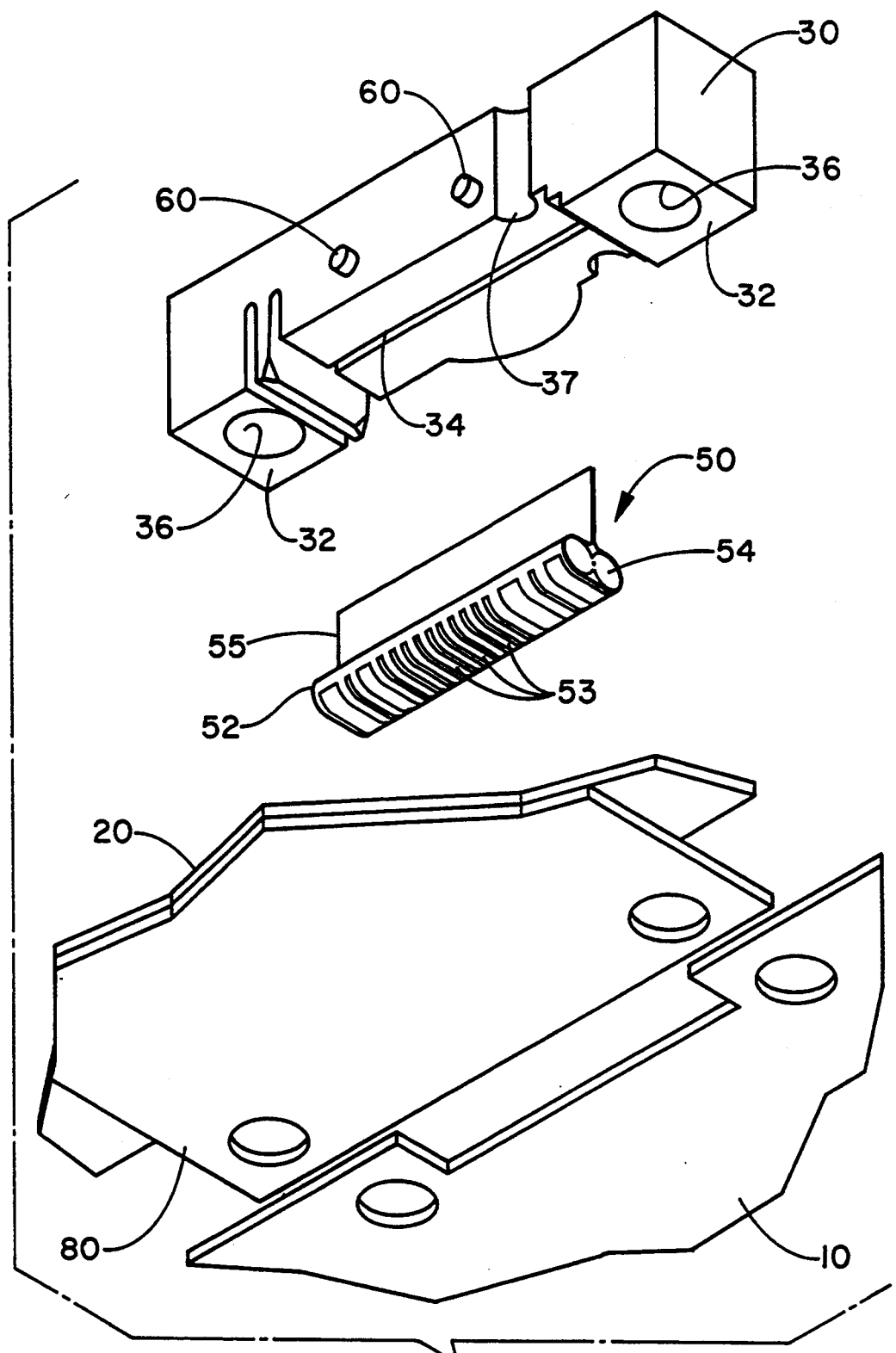
FIG. 4 is an exploded perspective view of the interface of FIG. 1.

FIG. 4 is an exploded perspective view of the interface of FIG. 1 which illustrates various component parts of the interface.

The mechanical interface is completed by a support housing 30 which overlies the junction. Support housing 30 serves to sandwich the compressible circuit 50 against the two PC boards 10 and 20. Base 80 provides an underlying foundation for anchoring the support housing 30, and the two PC boards 10 and 20 are compressed between support housing 30 and base 80.

The support housing 30 has a generally rectilinear profile with flanking struts 32 bearing flat bases for engaging the PC boards 10 and 20. The undersurface of the support housing 30 between the struts 32 is recessed to accommodate the compressible circuit 50, and the recessed undersurface is formed with an inwardly projecting slot 34 for aligning the compressible circuit 50.

The compressible circuit 50 is formed with a flexible film 52 having a plurality of conductive jumper traces photolithographically etched or otherwise formed thereon. Flexible film 52 is wrapped around an elastomeric compression plug 54. AMP Incorporated of Harrisburg, Pa., supplies a wide variety of such compressible circuits for the electronic and aerospace industries under its trademark AMPLIFLEX ®. The compressible circuit 50 used in the present invention must be keyed to the support housing 30, and this is best accomplished by wrapping the flexible film around the compression plug 54 and overlaying the ends in a perpendicular tail 55. The tail 55 is then inserted within the slot 34 in support housing 30 and is secured therein in a manner yet to be described.

When mounted on the two PC boards 10 and 20, the support housing 30 overlays the compressible circuit 50 across junction of the two PC boards such that the conductive jumper traces 53 traverse the two boards 10 and 20. Each conductive jumper trace 53 is pressed into contact with corresponding PC board traces 12 and 22 (see FIG. 2), and each conductive jumper 53 establishes an electrical path from one conductive trace 22 on the second PC board 20 to corresponding conductive trace 12 on the first PC board 10. The compression plug 54 may be shaped as an integral pair of cylinders (as shown) to insure that the flexible film 52 is uniformly biased against both circuit boards 10 and 20 on both sides of the junction.

The present invention excels in accommodating all dimensional tolerances of the two PC boards 10 and 20 while still insuring reliable contact between the close-pitch traces 12 and 22. As previously described, reliable high-density contact requires an exact alignment of the compressible circuit 50 between the two PC boards 10 and 20. Given current photolithographic techniques, it is contemplated that the density of the conductive traces 12 and 22 as arranged along the edge of the PC boards 10 and 20 will not exceed one millimeter in pitch. The tight pitch spacing of the conductive traces 12 and 22 coupled with inevitably large manufacturing tolerances in the horizontal dimensions of PC boards greatly complicates lateral alignment of the compressible circuit 50 across the two PC boards 10 and 20. This task of alignment may be broken down as follows: 1) the compressible circuit 50 must be precisely fixed to the support housing 30; and 2) the support housing 30 must be precisely anchored to the two PC boards 10 and 20.

Figure 5:
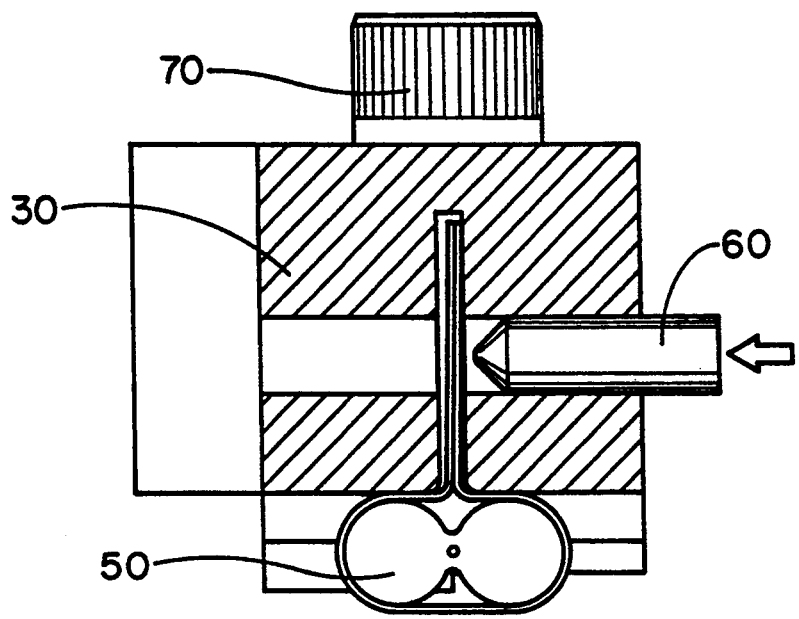
FIGS. 5 and 6 are side cross-sectional views showing the manner by which the compressible circuit 50 is assembled and secured in the support housing 30 according to the present invention.
Figure 6:
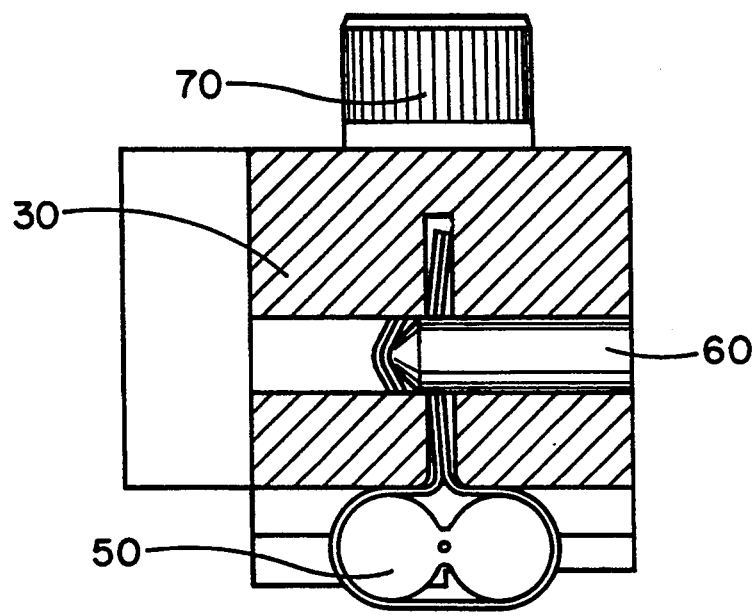

FIGS. 4-6 illustrate how the compressible circuit 50 is precisely fixed to the support housing 30. As shown in FIG. 4, the support housing 30 is formed with an optical alignment index 37 at a lateral position corresponding to, for instance, the end of compressible circuit 50. The extending tail 55 of compressible circuit 50 is inserted into the slot 34 in support housing 30, and compressible circuit 50 is then laterally adjusted until precisely aligned with the optical index As shown in FIG. 5, once the compressible circuit 50 is aligned within slot 34, posts 60 are driven inward (per the arrow) against the extending tail 55 of compressible circuit 50.

As seen in FIG. 6, posts 60 are driven into support housings 30 until flush therewith. Each post 60 indents the tail 55, and this permanently affixes the compressible circuit 50 within support housing 30. The above-described operation can be accomplished manually or automatically using a conventional optical probe. In the latter case, the optical index 37 should be located in a rounded channel (as shown) to guide insertion of the optical probe.

Once the compressible circuit 50 is affixed to support housing 30, it remains to precisely position and anchor the support housing to the two PC boards 10 and 20.

Figure 7:
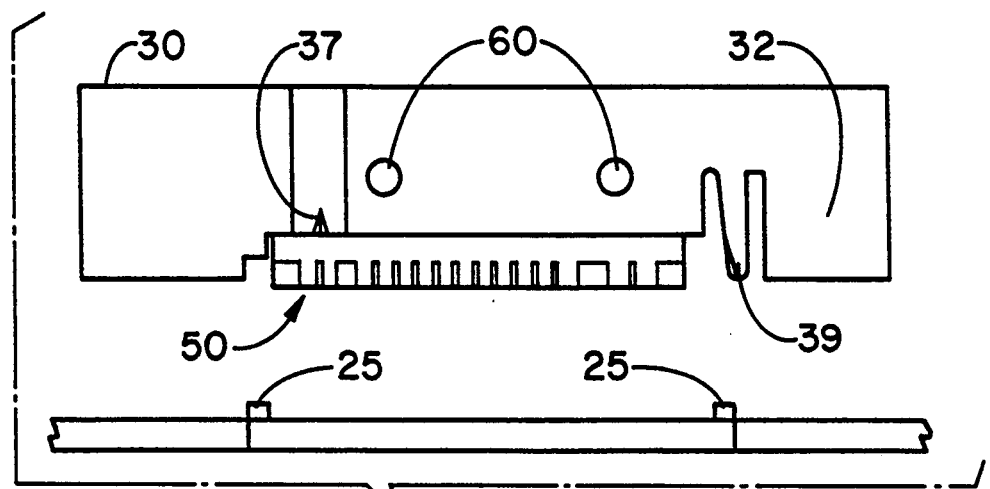
FIGS. 7 and 8 are front partially enlarged views showing the manner by which the support housing 30 engages the first and second PC boards 10 and 20.
Figure 8:
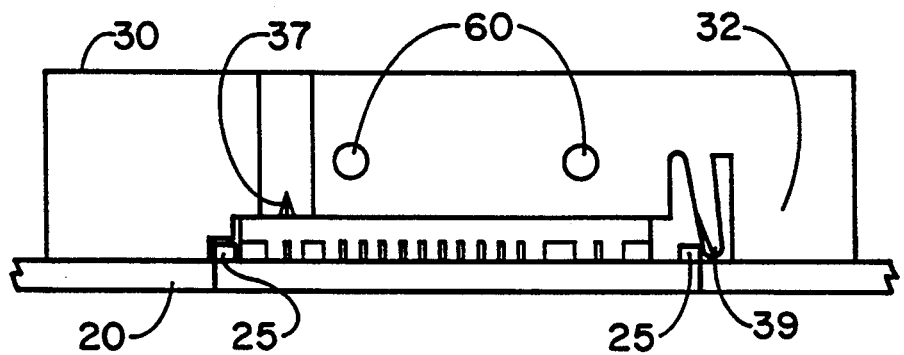

FIGS. 7 and 8 illustrate an exemplary means by which the above can be accomplished. PC board 20 is provided with two guide tabs 25 flanking the projection therefrom. The support housing 30 conforms to tabs 25 and is formed such that the tabs 25 are received between the downwardly extended struts 32. To help in taking up tolerances, a resilient finger 39 is preferably formed closely adjacent one on the downwardly extended struts 32 so that the corresponding tab 25 will abut the resilient finger 39. The length of resilient finger 39 should match that of the adjacent strut 32. In addition, the resilient finger 39 should be slightly offset from tab 25 and should protrude directly downward thereto. Preferably, the resilient finger 39 is formed with a ramped surface in the downward tip as shown. This way, as shown in FIG. 8, when the downwardly extended struts 32 of support housing 30 are brought into engagement with PC board 10, the resilient finger 39 will ride down the corresponding tab 25, and tab 25 will bias finger 39 progressively outward toward the adjacent strut 32. At the same time, the opposite tab 25 snugly abuts the other strut 32. Consequently, support housing 30 compresses the two tabs 25 together, and the compressive force serves to temporarily support housing 30 on the PC boards.

The guide tabs 25 formed in PC board 20 can be formed at a precise position relative to the respective conductive traces (or contact pads) 22 of PC board 20, and the compressible circuit 50 can likewise be precisely positioned with respect to the guide housing 30. The support housing of the present invention integrates these two capabilities into a precise overall alignment of the conductive jumpers 52 between the contact pads 12 of the first PC board 10 to the contact pads 22 of the second PC board 20. The precision of the horizontal alignment which may be achieved using the above-described invention is sufficient for strict controlled impedance constraints.

Figure 9:
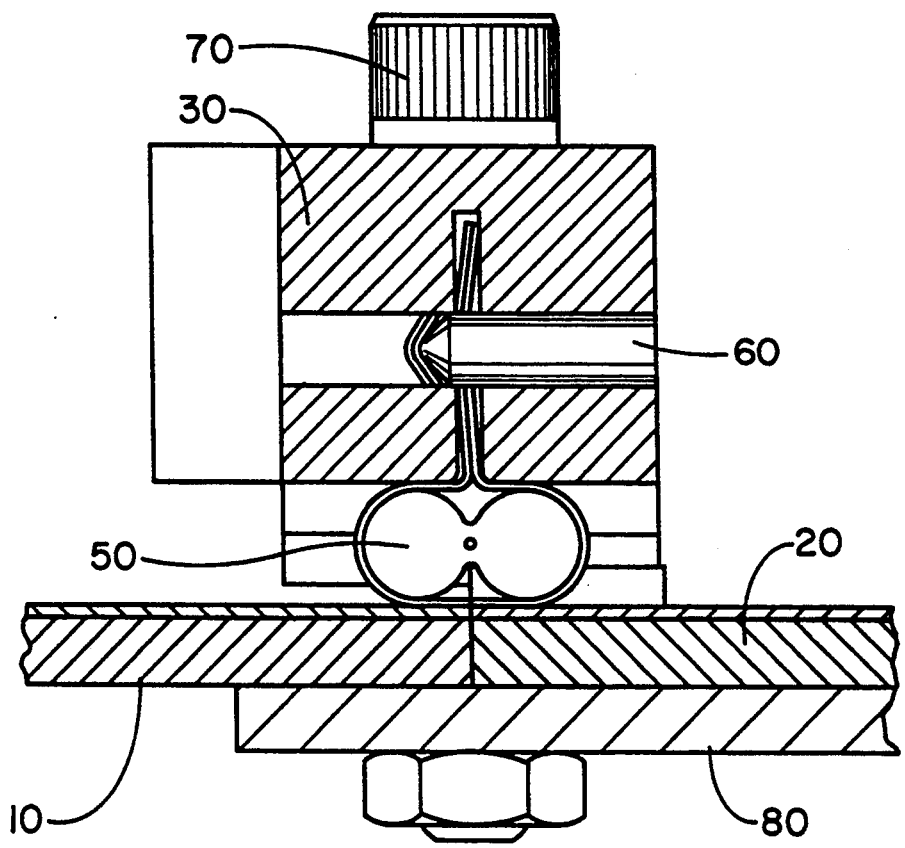
FIG. 9 is a side cross-section of the completed interface of two co-planar printed circuit ("PC") boards 10 and 20 in accordance with the present invention.

FIG. 9 is a side cross-section illustrating the manner by which support housing 30 is anchored against the two PC boards 10 and 20. Support housing 30 is integrally secured by a pair of anchors 70 which may be, for example, conventional hex bolts, pylons or other mounting means. Anchors 70 are passed through the mounting holes in the support housing 30 and in the first PC board 10. The anchors 70 are then secured to the base 80 by threaded hex nuts or the like. The holes 16, 36 and 56 are oversized to allow a degree of lateral freedom ("float"). This configuration accommodates thickness differentials between the PC boards 10, 20 because support housing 30 is anchored only to the base 80 which underlies the second PC board 20. The first PC board 10 is free to float vertically while the support housing 30 is tightened against the base 80. This way, the thickness of the first PC board 10 may vary with respect to the second PC board 20 throughout the tightening procedure. The vertical float coupled with the lateral float provides the overall freedom necessary to bring the downwardly extended struts 32 of support housing 30 into engagement with PC board 10, and to catch the resilient finger 39 on the corresponding tab 25 prior to fully tightening the anchors 70.

Tightening of anchors 70 biases the compressible circuit 50 against the two PC boards 10 and 20, and the compression plug 54 maintains the conductive jumpers 52 of the compressible circuit 50 in electrical contact with the contact pads 12, 22 of the two PC boards despite differences in thickness. In addition, a precise horizontal alignment is maintained from the contact pads 12 of the first PC board 10 to the contact pads 22 of the second PC board 20 via the conductive jumpers 52.

We claim:

1. An interface for joining two printed circuit ("PC") boards in a co-planar relation, comprising:
    a first PC board having a plurality of conductive traces thereon;
    a second PC board having a plurality of conductive traces thereon;
    a base underlying said first PC board and protruding therefrom to form a ledge for seating said second PC board;
    a compressible circuit for bridging said first and second PC boards, said compressible circuit being formed from an elastomeric compression plug and a flexible circuit having a plurality of conductive jumper traces thereon for electrically connecting the conductive traces of the first PC board with the conductive traces of the second PC board, said flexible circuit being wrapped around said compression plug and overlaid at ends thereof to form a tail;
    a support housing formed with two supporting struts both having flat mounting surfaces for engaging said first and second PC boards, and a central slot extending between said supporting struts for receiving the tail of said compressible circuit and carrying said compressible circuit therebetween, said support housing being anchorable to said base with said supporting struts and compressible circuit straddling a juncture of said two PC boards;
    whereby said supporting struts fix the relative vertical positions of the two PC boards in a substantially co-planar relation, and said compressible circuit electrically connects the conductive traces of the first PC board with the conductive traces of the second PC board.

2. The interface according to claim 1, further comprising a plurality of posts insertable transversely through the slot in said support housing for capturing the tail of said compressible circuit when inserted therein, and for thereby fastening said compressible circuit in said supporting housing.

3. The interface according to claim 1, wherein said support housing bears an optical alignment index to allow optical alignment of said compressible circuit.

4. The interface according to claim 1, wherein said support housing is recessed between said two supporting struts, and said central slot extends between said supporting struts within said recess for receiving the tail of said compressible circuit, said compressible circuit being carried thereby within said recess.

5. The interface according to claim 4, wherein said compressible circuit is urged against said two PC boards when said supporting struts are engaged thereagainst.

6. An interface for joining two printed circuit ("PC") boards in a co-planar relation, comprising:
- a first PC board having a plurality of conductive traces thereon;
- a second PC board having a plurality of conductive traces thereon, and a plurality of guide tabs formed at a precise position relative to the respective conductive traces;
- a compressible circuit for bridging said first and second PC boards, said compressible circuit being formed from an elastomeric compression plug wrapped by a flexible circuit having a plurality of conductive jumper traces thereon for electrically connecting the conductive traces of the first PC board with the conductive traces of the second PC board;
- a support housing formed with two supporting struts and a central recess extending between said supporting struts for carrying said compressible circuit, said supporting struts being formed with flat mounting surfaces for engaging said first and second PC boards, and said struts conforming to said guide tabs of said second PC board for alignment with respect thereto,
- whereby said support housing is anchorable to a base with said compressible circuit sandwiched against a juncture of said two PC boards, and said supporting struts are positioned via said guide tabs to precisely align the plurality of conductive jumper traces on said compressible circuit between the conductive traces of the first PC board and the conductive traces of the second board.

7. The interface according to claim 6, wherein one of the supporting struts of said support housing is formed with a guide facet for receiving a corresponding guide tab on said second PC board, and another of said supporting struts is formed with a resilient finger adjacent thereto and extending downwardly for engagement with another of said guide tabs.

8. The interface according to claim 7, wherein said resilient finger engages said another guide tab for alignment therewith and rides over said guide tab when said support housing is pressed against the two PC boards, said resilient finger thereby maintaining a resilient bias against said another guide tab to temporarily mount said support housing on said two PC boards.

9. The interface according to claim 8, wherein said resilient finger is formed with a ramped surface at a downwardly extending tip to aid in engaging and riding over said other guide tab when said support housing is pressed against the two PC boards.

10. An interface, comprising:
- a first PC board formed with a notch along one edge and a plurality of circuit traces exposed inwardly of said notch;
- a second PC board formed with a projecting section along one edge and a plurality of circuit traces exposed along said projecting section;
- a base underlying said first PC board and protruding therefrom such that a ledge is extended for seating the second PC board adjacent to the first PC board;
- a compressible circuit for bridging said first and second PC boards, said compressible circuit being formed from an elastomeric compression plug wrapped by a flexible circuit have a plurality of conductive jumper traces thereon for electrically connecting the conductive traces of the first PC board with the conductive traces of the second PC board;
- a support housing formed with two supporting struts and a central recess extending between said supporting struts for receiving a tail of said compressible circuit and carrying said compressible circuit therebetween, said supporting struts being formed with flat mounting surfaces for engaging said first and second PC boards; and
- a plurality of anchors for securing said support housing against said first and second PC boards with said compressible circuit sandwiched therebetween, said anchors penetrating said supporting struts, said first PC board, and said base to tighten said anchors against said base to bias the compressible circuit against the respective traces on said first and second PC boards.

11. The interface according to claim 10, wherein said support housing is overlaid across said first and second PC boards with said compressible circuit sandwiched between said housing and PC boards, and said support housing may be tightened against the base for compressing the jumper traces of the flexible circuit against said first and second PC boards.

12. The interface according to claim 11, wherein said base further comprises a blank circuit board.

* * * * *